US010180917B2

(12) United States Patent
Sauer et al.

(10) Patent No.: US 10,180,917 B2
(45) Date of Patent: Jan. 15, 2019

(54) INTERFACE UNIT FOR ROUTING PRIORITIZED INPUT DATA TO A PROCESSOR

(71) Applicant: dSPACE digital signal processing and control engineering GmbH, Paderborn (DE)

(72) Inventors: Jochen Sauer, Brakel (DE); Robert Leinfellner, Paderborn (DE); Matthias Klemm, Paderborn (DE); Thorsten Brehm, Paderborn (DE); Robert Polnau, Paderborn (DE); Matthias Schmitz, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 200 days.

(21) Appl. No.: 15/151,767

(22) Filed: May 11, 2016

(65) Prior Publication Data

US 2016/0335203 A1    Nov. 17, 2016

(30) Foreign Application Priority Data

May 11, 2015   (DE) .................. 10 2015 107 296
May 11, 2015   (DE) .................. 10 2015 107 299
(Continued)

(51) Int. Cl.
*G06F 13/10*    (2006.01)
*G06F 13/40*    (2006.01)
(Continued)

(52) U.S. Cl.
CPC ........ *G06F 13/102* (2013.01); *G06F 9/44505* (2013.01); *G06F 13/126* (2013.01);
(Continued)

(58) Field of Classification Search
CPC ... G06F 1/12; G06F 3/00; G06F 9/455; G06F 13/00
See application file for complete search history.

(56) References Cited

U.S. PATENT DOCUMENTS 6,539,488 B1 *   3/2003   Tota .................... G06F 5/06
                                                     710/305
7,478,179 B2    1/2009   Moore et al.
(Continued)

FOREIGN PATENT DOCUMENTS

EP    1 334 590 B1    10/2006
EP    2 799 983 A1    11/2014
WO    WO 96/41272 A1    12/1996

OTHER PUBLICATIONS

Extended European Search Report for European Application No. 15193579.8 dated Mar. 17, 2016 with English translation.
(Continued)

*Primary Examiner* — Farley Abad
*Assistant Examiner* — Getente A Yimer
(74) *Attorney, Agent, or Firm* — Muncy, Geissler, Olds & Lowe, P.C.

(57) ABSTRACT

An interface unit for data exchange between a first processor of a computer system and a peripheral environment. The interface unit has a number of input data channels for receiving input data from the peripheral environment and a first access management unit. The access management unit is configured to receive a request for providing the input data, stored in the number of input data channels, from a first interface processor stored in the interface unit and from a second interface processor stored in the interface unit and to provide or not to provide the input data, stored in the number of input data channels, to the first interface processor and the
(Continued)

second interface processor. A first priority and a second priority can be stored in the first access management unit.

14 Claims, 3 Drawing Sheets

(30) Foreign Application Priority Data

Nov. 9, 2015 (DE) .......................... 10 2015 119 201
Nov. 9, 2015 (DE) .......................... 10 2015 119 202

(51) Int. Cl.
| | | |
|---|---|---|
| *G11C 8/18* | (2006.01) | |
| *G06F 15/78* | (2006.01) | |
| *G06F 9/445* | (2018.01) | |
| *G06F 13/20* | (2006.01) | |
| *G06F 13/12* | (2006.01) | |
| *G06F 13/38* | (2006.01) | |
| *G06F 9/4401* | (2018.01) | |

(52) U.S. Cl.
CPC .......... *G06F 13/20* (2013.01); *G06F 13/4022* (2013.01); *G06F 13/4068* (2013.01); *G06F 13/4072* (2013.01); *G06F 15/7885* (2013.01); *G11C 8/18* (2013.01); *G06F 9/4411* (2013.01); *G06F 13/385* (2013.01)

(56) References Cited

U.S. PATENT DOCUMENTS

| | | |
|---|---|---|
| 8,863,135 B2 | 10/2014 | Wilianto et al. |
| 2003/0137979 A1 | 7/2003 | Hayon et al. |
| 2005/0066093 A1* | 3/2005 | Fuchikami .............. G06F 13/26 710/107 |
| 2005/0135419 A1* | 6/2005 | Pullen ................. H04L 49/3072 370/473 |
| 2006/0268914 A1* | 11/2006 | Smith ..................... H04L 43/18 370/412 |
| 2010/0030509 A1 | 2/2010 | Crain, II et al. |
| 2014/0324408 A1* | 10/2014 | Merten ................... G06F 9/455 703/21 |
| 2017/0045418 A1* | 2/2017 | Peperhowe ......... G06F 17/5009 |

OTHER PUBLICATIONS

Duelks et al., "A real-time test and simulation environment based on standard FPGA hardware," IEEE 2009 Testing: Academic and Industrial Conference—Practice and Techniques, pp. 197-204 (Sep. 4, 2009).

"Auf zu Schnelleren Zeiten," dSpace magazine, at: http://www.dspace.com/shared/data/pdf/2012/Magazine/4245quicktimes.pdf, pp. 1-4 (Jun. 1, 2012) with English translation.

Mertens et al., "When Processor and FPGA Work Together," dSpace magazine, at: http://www.dpace.com/shared/data/pdf//In2011/503dSpaceEkautomobile2011-06lowrespdf.pdf, pp. 1-3 (May 1, 2011) with English translation.

* cited by examiner

INTERFACE UNIT FOR ROUTING PRIORITIZED INPUT DATA TO A PROCESSOR

This nonprovisional application claims priority to German Patent Application No. 10 2015 107 299.8, which was filed in Germany on May 11, 2015, to German Patent Application No. 10 2015 107 296.3, which was filed in Germany on May 11, 2015, to German Patent Application No. 10 2015 119 202.0, which was filed in Germany on Nov. 9, 2015, and to German Patent Application No. 10 2015 119 201.2, which was filed on Nov. 9, 2015, and which are all herein incorporated by reference.

BACKGROUND OF THE INVENTION

Field of the Invention

The present invention relates to a method for managing prioritized input data and an interface unit.

Description of the Background Art

Many computer systems have interface units for data exchange between a main processor and peripheral devices. An interface unit of this kind can be designed, for example, as a plug-in I/O card. Many interface units are equipped with their own processors for preprocessing incoming and outgoing data, whereby some interface units make it possible to adapt the programming of the processor in the interface unit flexibly to the requirements of the computer program executed by the main processor.

If the computer system is provided to process the program being executed by the main process in hard real time, then it must be assured that the processes running on the computer system, in particular also the processes executed by the processors stored in the interface unit, are completed within a predefined time period. An example of such systems is test systems for electronic control units.

In principle, data processing in hard real time means that the data are processed sufficiently rapidly in order to assure their processing within a predetermined time period. In this case, the basic aim is the efficient processing of the data. The prioritizing of input data supplied by a peripheral is known from the state of the art. In this case, especially time-critical input data are provided a higher priority than less time-critical input data, and more highly prioritized input data are routed and processed preferentially. It is also known from the prior art to store the priorities assigned to the input data in the interface unit and to allow the interface unit to prioritize the input data independently. The patent application US 2003 0137979 A1 describes a switch, which is designed to recognize data to be processed in real time, for example, for video streaming, and to forward them preferentially. Patent application WO 1996 041272 A1 describes a bus arbiter for data exchange between a processor and a peripheral. Peripheral devices whose input data must be processed in real time can bring about by means of a special signal the preferred routing of their input data by the bus arbiter. The DS2671 bus board offered by dSPACE GmbH is an interface unit with a single processor, whereby priorities for tasks to be executed by a main processor can be stored in the processor, whereby input data for highly prioritized tasks are routed preferentially.

SUMMARY OF THE INVENTION

It is therefore an object of the invention to provide an interface unit and a method for the sufficiently rapid and low-jitter routing of input data in hard real time.

In the context of the following description of the invention, the term "or" should not to be understood in the logical sense as an exclusive "or." A term "A or B" accordingly also includes the term "A and B." Access to a resource of the computer system can be understood as the possibility of using the resource according to the designated use.

The subject of the invention accordingly is a method for managing prioritized input data in a computer system with a first processor, an interface unit, and a first data link between the first processor and the interface unit, whereby the interface unit has a first interface processor and a second interface processor and is configured to receive input data from a peripheral environment in a number of input data channels of the interface unit and to route the input data via the first data link to the first processor. Further, a peripheral environment of the computer system is configured to store input data by means of a second data link in the number of input data channels. A computer program is stored in the computer system and the computer program is configured to read in a value, defined by the input data, in order to assign a value to a variable of the computer program, and the first processor is programmed to execute the computer program.

The interface unit has a first access management unit, which is designed to control the access of the first interface processor and the second interface processor to the input data stored in the input data channels, and the first interface processor and the second interface processor are each configured to send a request for providing the input data, stored in the number of input data channels, to the first access management unit and to route the input data to the first processor or to process the input data and to route the processed input data to the first processor.

The method of the invention provides for storing a first priority and a second priority in the first access management unit, whereby the first access management unit is configured to provide or not to provide upon request the input data, stored in the number of input data channels, to the first interface processor and the second interface processor during the execution of the computer program by the first processor and to provide the input data first to the first interface processor, if there is a request for providing the input data, stored in the number of input data channels, from both the first interface processor and the second interface processor and the first priority is higher than the second priority.

An interface processor in the context of the invention can be taken to mean a processor stored in the interface unit, which is configurable and is provided to route input data, generated by a peripheral environment, to the first processor, i.e., to read an input datum stored in an input data channel and to store a copy of the input datum at a memory address readable by the first processor or to arrange for a copy of the input datum to be stored at a memory address readable by the first processor, or to read an input datum stored in an input data channel, to process it, and to store a result of the processing of the input datum at a memory address readable by the first processor or to arrange for a result of the processing of the input datum to be stored at a memory address readable by the first processor.

An important distinction of the invention over the prior art is that a plurality of interface processors are stored in the interface unit and the priorities, stored in the interface unit, refer to the interface processors. Highly prioritized interface processors receive preferred access to the input data channels and the input data stored there. An advantage of the invention is that it enables parallel processing and routing of prioritized input data. With the use of at least two interface processors, different program routines for routing and processing of input data, for example, for different tasks of the computer program, can be executed in parallel and independently of one another in the interface unit. In particular as is of great importance for data processing in real time, the processing time of the program routines in the interface unit is predictable as a result, because program routines are not interrupted in favor of more highly prioritized program routines. At the same time, the different program routines can be prioritized in the interface unit with respect to their access to the input data channels, because the access to the input data channels is managed by an instance at a higher level than the interface processors, the first access management unit.

In an embodiment, a first task and a second task of the computer program are configured to read in a value, defined by the input data, in order to assign a value to a variable of the computer program, whereby the first task is assigned a first priority and the second task a second priority, and the first interface processor is configured to route input data to the first task or to process input data and to route the processed input data to the first task, and whereby the second interface processor is configured to route input data to the second task or to process input data and to route the processed input data to the second task, whereby the first priority assigned to the first task and the second priority assigned to the second task are stored in the access management unit.

In this embodiment, therefore, individual tasks of the computer program are assigned a priority, and the first interface processor and the second interface processor are each assigned to a task such that the input data, routed by the first interface processor, are read by the first task and the input data, routed by the second interface processor, are read by the second task, and the priorities assigned to the individual tasks are inherited in the interface processors assigned to the individual task, i.e., stored in the interface unit and assigned to the interface processors assigned to the particular task.

This type of priority inheritance of a task in an interface processor assigned to it is equivalent to a prioritizing of the input data read in by the task. The priority of a task in technical terms is a numerical quantity on the basis of which the computer system, especially the interface unit, decides which tasks receive access preferentially to its input data. A priority can be formally assigned to a task, an interface processor, or the input data routed by the interface processor.

The interface unit in an embodiment is designed as a replaceable interface unit, in particular as a plug-in I/O card. A replaceable interface unit according to the invention can mean that the interface unit is designed as a modular component of a computer system and the interface unit is provided to be removed from the computer system by a user of the computer system and to be replaced by another modular component. A plug-in I/O card in relation to the invention constitutes an interface unit which is designed as a plug-in printed circuit board and is provided to be inserted in a slot of a modular computer system and to route input data from a peripheral environment of the computer system to a first processor of the computer system.

The computer system can be configured to execute the computer program in hard real time. The computer system can also be designed as a hardware-in-the-loop simulator (HIL) or as a rapid control prototyping platform.

A hardware-in-the-loop simulator in connection with the invention can be understood to be a computer system that is configured and provided to be connected to the data inputs and data outputs of an embedded system, for example, an electronic control unit or a mechatronic component, and that is configured, also with respect to the hardware built into the computer system, to simulate the real environment of the embedded system in hard real time.

A rapid control prototyping system in connection with the invention can be understood to be in particular a portable computer system that is configured and provided to be integrated into a network of electronic control units, for example, in an automobile, to take over temporarily the task of an electronic control unit in the network, and to exchange data with electronic control units in hard real time, to read in data from sensors, and to control actuators.

In an embodiment, the interface unit further has a second access management unit, whereby the first and second interface processors are configured to send a request to the second access management unit for access to the first data link, whereby the second access management unit is configured to grant or not to grant the first interface processor and the second interface processor access to the first data link upon request during the execution of the computer program by the first processor and to grant the first interface processor access to the first data link first, if there is a request for access to the first data link from both the first interface processor and the second interface processor and the first priority is higher than the second priority.

A computer system configuration phase can be started before the execution of the computer program is begun by the first processor, whereby the computer system, for example the first processor, configures the first processor and the second processor during the configuration phase. In particular, the first priority and the second priority are stored in the first access management unit during the configuration phase. If a second access management unit is stored, the first priority and the second priority are stored in the first access management unit and in the second access management unit during the configuration phase.

In an embodiment, the interface unit has more than two interface processors, therefore apart from the first interface processor and second interface processor at least one other third interface processor, and each interface processor is either unambiguously assigned to a task of the computer program or is not assigned to any task of the computer program.

According to an embodiment of the invention, the interface processors execute program routines in order to route the input data unchanged or in processed form to the first processor. Assignment of an interface processor to a task can mean that the input data, routed by the interface processor, are read in by the task. An interface processor is unambiguously assigned to a task, if the input data, routed by the interface processor, are read in exclusively by the task. Each interface processor can be configured to make a request for providing the input data stored in the number of input data channels, and a priority is stored for each interface processor assigned to a task.

Furthermore, the interface unit can have at least one output data channel, whereby the output data channel can be configured and provided to store output data in the output data channel and to allow the output data, stored in the output data channel, to be read by a peripheral environment of the computer system, and a third interface processor is configured to store output data, generated by the computer program, in the output data channel. A first direct data link, bypassing the second access management unit, is established between the first processor and the third interface processor; i.e., the third interface processor is designed to read the output data and to store them in the data output channel, without sending a request for access to the first data link to the second access management unit.

In an embodiment of the invention, a second direct data link, bypassing the first access management unit, is established between an interface processor and an input data channel or an output data channel. This means that an interface processor, for example, the interface processor with the highest priority, is configured to read in input data from an input data channel, without sending a request for providing the input data, stored in the input data channel, to the first access management unit, or an interface processor, for example, the interface processor with the highest priority, is configured to store output data in an output data channel, without sending a request for access to the output data channel to the first access management unit.

An FPGA (Field Programmable Gate Array) can be installed in the interface unit, and the interface processors are stored as soft-core processors in the FPGA or are made to be stored as soft-core processors in the FPGA, in particular during the configuration phase. The programming of a soft-core processor in a FPGA is familiar to the skilled artisan from the prior art. A skilled artisan understands a soft-core processor to be a processor programmed in the logic circuit of an FPGA.

A further subject of the invention is an interface unit for data exchange between a first processor of a computer system and a peripheral environment of the computer system. The interface unit has a data connection for connecting the interface unit to a first data link of the computer system, whereby data is transferable from the interface unit to the first processor by means of the first data link. The interface unit furthermore has a number of input data channels for receiving input data from the peripheral environment, whereby the input data can be stored in the number of input data channels. The interface unit has a first access management unit, and the first access management unit is configured to receive a request for providing the input data, stored in the number of input data channels, from a first interface processor stored in the interface unit and from a second interface processor stored in the interface unit and to provide or not to provide upon request the input data, stored in the number of input data channels, to the first interface processor and the second interface processor.

A first priority and a second priority can be stored in the first access management unit; i.e., the first access management unit is configured to receive and store values for a first priority and for a second priority. Furthermore, the first access management unit is configured to provide the input data, stored in the number of input data channels, first to the first interface processor, if there is a request for providing the input data, stored in the number of input data channels, from both the first interface processor and the second interface processor and the first priority is higher than the second priority.

The interface unit additionally can have a second access management unit, whereby the first priority and the second priority can be stored in the second access management unit. In this case, the second access management unit is configured to accept a request for access to the first data link from the first interface processor and the second interface processor, to grant or not to grant the access, and to grant access to the first data link first for the first interface processor, if there is a request for access to the first data link from both the first interface processor and the second interface processor and the first priority is higher than the second priority.

In an embodiment, an FPGA programmable by the computer system is built into the interface unit, whereby the FPGA is configured to store the first interface processor and the second interface processor in the form of soft-core processors. Preferably, furthermore, the first access management unit is configured to provide the input data, stored in any input data channel, to the first interface processor and the second interface processor. This means that the input data stored in any input data channel of the interface unit can be read by each interface processor, provided the first access management unit has granted the relevant interface processor access to the number of input data channels.

Further scope of applicability of the present invention will become apparent from the detailed description given hereinafter. However, it should be understood that the detailed description and specific examples, while indicating preferred embodiments of the invention, are given by way of illustration only, since various changes, combinations and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
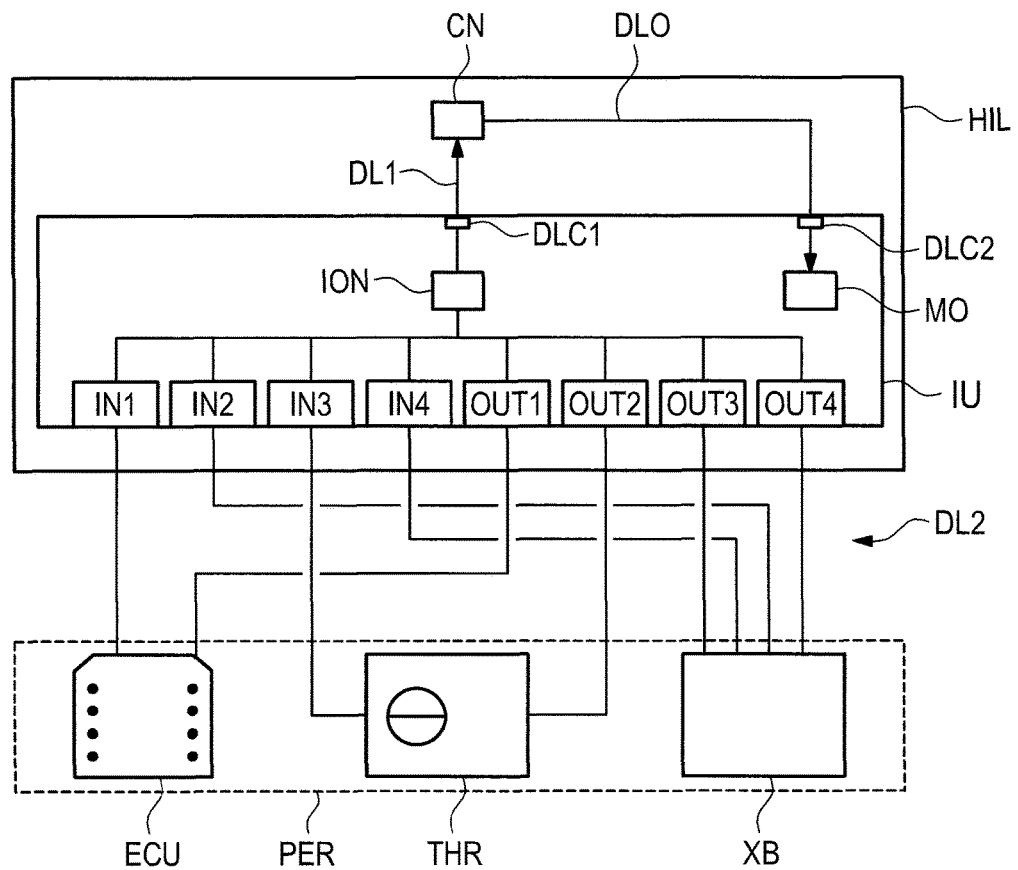
FIG. 1 shows a computer system with an interface unit known from the conventional art.

The illustration of FIG. 1 provides a drawing of a computer system HIL, designed as a hardware-in-the-loop simulator, with an interface unit IU, as is known from the conventional art. A first processor CN is built into the computer system HIL, a first data link DL1 is configured to send data from interface unit IU to first processor CN, and an output data link DLO is configured to send data from first processor CN to an internal memory MO of interface unit IU. Internal memory MO is readable by interface processor ION. Interface unit IU has a number of four input data channels, a first input data channel IN1, a second input data channel IN2, a third input data channel IN3, and a fourth input data channel IN4, and interface unit IU has a number of four output data channels, a first output data channel OUT1, a second output data channel OUT2, a third output data channel OUT3, and a fourth output data channel OUT4. A peripheral environment PER of computer system HIL is configured to store input data by means of a second data link DL2, made up of a plurality of cable connections, in input data channels IN1, ..., IN4 and to read output data from output data channels OUT1, ..., OUT4. A data channel processor (not shown) is stored in each input data channel IN1, ..., IN4 and in each output data channel OUT1, ..., OUT4. Each data channel processor, stored in an input data channel IN1, ..., IN4, is writable by peripheral environment PER, if second data link DL2 has a cable connection configured therefor, and each data channel processor, stored in an output data channel OUT1, ..., OUT4, is readable by peripheral environment PER, if second data link DL2 has a cable connection configured therefor.

Peripheral environment PER contains three peripheral components: an electronic control unit ECU, an actual load THR, and an extension box XB. Second data link DL2 is configured as a plurality of cable connections, which are run between the peripheral components THR, ECU, XB of peripheral environment PER and input data channels IN1, . . . , IN4, and output data channels OUT1, . . . , OUT4 of interface unit IU. Electronic control unit ECU is a physical control unit, for example, an automotive control unit, which is integrated into the simulation, in order to test the software stored in electronic control unit ECU for correct functioning. To this end, first processor CN simulates by means of a computer program, stored in the first processor CN, in hard real time the environment of the electronic control unit, in particular other electronic control units, sensors, actuators, and driving maneuvers of the simulated vehicle, and to this end exchanges data with electronic control unit ECU. The electronic control unit is configured to read in output data, generated by the first processor CN, from first output data channel OUT1 of interface unit IU, and it is configured to store input data, generated by the electronic control unit, in first input data channel IN1 for evaluation by first processor CN, for example, a control signal for a component simulated by first processor CN.

The actual load THR is, for example, a throttle valve of an automobile. Because the computer program is not configured to simulate a throttle valve, the throttle valve is integrated in the simulation as a physical component. First processor CN generates a control signal for an actuator of actual load THR according to the specifications of the computer program, and the control signal is transmitted via second data output channel OUT2 of interface unit IU to the actuator. A sensor of actual load THR is read via third input data channel IN3 of interface unit IU and the read sensor signal is evaluated by first processor CN based on the specifications of the computer program.

Extension box XB contains further computer components, assisting first processor CN in the execution of the computer program, in the form of plug-in printed circuit boards. Extension box XB is configured to read in output data from third output data channel OUT3 and fourth output data channel OUT4 and to store input data in second input data channel IN2 and fourth input data channel IN4.

A single interface processor ION is installed in interface unit IU. The memory addresses of the data channel processors stored in input data channels IN1, . . . , IN4 are readable by interface processor ION, and the memory addresses of the data channel processors, stored in output data channels OUT1, . . . , OUT4, are writable by interface processor ION. A plurality of program functions are stored in interface processor ION in order to process input data stored in the number of input data channels IN1, . . . , IN4 and to route them to first processor CN, i.e., to read in an input datum at a memory address of the data channel processors stored in input data channels IN1, . . . , IN4, optionally to process the read-in input datum, and to write the input datum in processed form or unchanged at a memory address readable by first processor CN or to arrange for the input datum to be written in processed form or unchanged at a memory address readable by first processor CN. In addition, a plurality of program functions are stored in interface processor ION to process output data stored by first processor CN, and to route them to peripheral environment PER, i.e., in order to read in an output datum, generated by the computer program, at a memory address, optionally to process the read-in output datum, and to store the output datum in processed form or unchanged at a memory address of data channel processors stored in output data channels OUT1, . . . , OUT4.

Interface unit IU is designed as a plug-in I/O card and configured to be connected by insertion in a slot of computer system HIL via an input data connection DLC1 and an output data connection DLC2 to the internal bus of computer system HIL, whereby the data connections between first processor CN and interface unit IU are made by means of the internal bus. The interface unit is connected to first data link DL1 by means of input data connection DLC1 and to output data connection DLO by means of output data connection DLC2.

A simulation run with computer system HIL proceeds such that a computer program for simulating an environment of electronic control unit ECU is stored in computer system HIL and first processor CN is programmed to execute the computer program. The computer program includes a plurality of tasks, whereby several tasks exchange data with peripheral environment PER, therefore read in and process input data supplied by peripheral environment PER or send the output data to peripheral environment PER. The tasks of the computer program to exchange the data with the peripheral environment PER are designated below as I/O tasks.

Before the execution of the computer program begins, a configuration phase of computer system HIL is started in order to configure computer system HIL and peripheral environment PER for executing the computer program. During the configuration phase a program routine is configured in interface processor ION for each I/O task, whereby each program routine is designed at least to read in the input data from an input data channel IN1, . . . , IN4 and to route them to a memory address readable by first processor CN or to read the output data, stored by first processor CN, from internal memory MO and to route them in an output data channel OUT1, . . . , OUT4. Each program routine can be designed optionally, moreover, to process the read-in input data or output data before routing, for example, to packet, scale, calculate, or logically process them.

Each I/O task is assigned a priority during the configuration phase, and the priorities of the I/O tasks are stored during the configuration phase in interface processor ION. Interface processor ION is configured to process and route preferentially the input data or output data of highly prioritized I/O tasks.

In view of the demands on computer system HIL to execute the computer program in hard real time and consequently also to carry out the data exchange with peripheral environment PER in hard real time, the just described method for routing input data and output data by means of an interface unit IU as in the illustration of FIG. 1 is problematic. For hard real time, the execution of program routines must not only occur sufficiently rapidly, but the time needed for the execution must also be predictable with a high accuracy in order to be able to guarantee a sufficiently rapid execution. In the design shown in FIG. 1, it is possible that the execution of a program routine running on interface processor ION is interrupted in favor of another program routine that is assigned a more highly prioritized task. In order to execute all program routines running on interface processor ION sufficiently rapidly, nevertheless, a rapid processor can be used as interface processor ION. Such processors have different technical measures for accelerating the execution of program routines, however, which in addition reduce the predictability of the time needed for executing program routines, for example, automatic parallelization in a plurality of processor cores and caching.

A structure for an interface unit IU, as shown in the illustration of FIG. 1, accordingly due to the layout leads to unpredictable variations in the execution time of program routines for routing and processing input data and output data to the interface unit on a scale that is problematic for hard real-time requirements. Such variations are known to the skilled artisan as jitter. Against this background, it is the object of the invention to describe an interface unit or a method for a sufficiently rapid and low-jitter routing of input data in hard real time.

Figure 2:
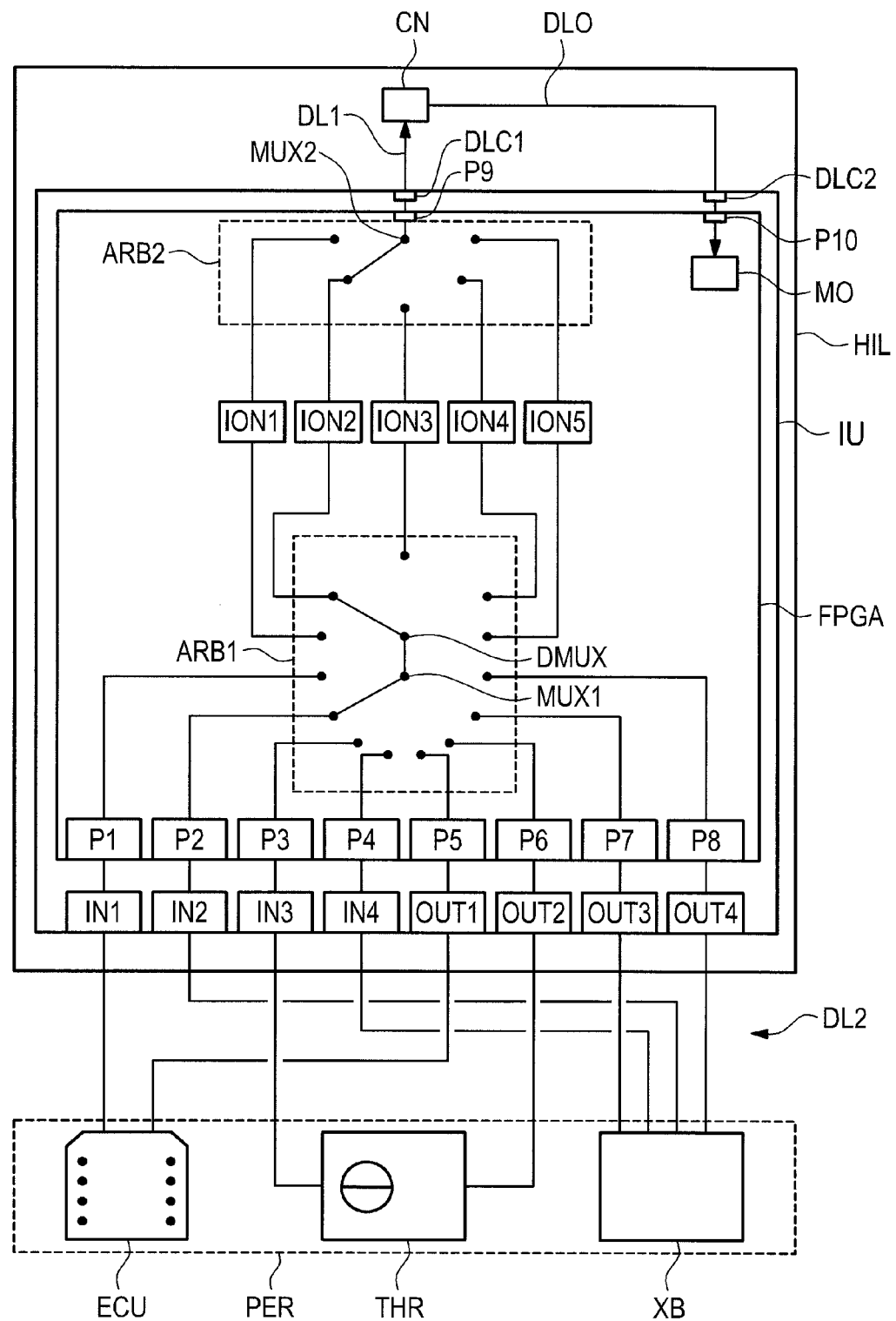
FIG. 2 shows a computer system with an interface unit according to an embodiment of the invention.

The illustration in FIG. 2 shows an embodiment of the invention. Only the differences from the illustration in FIG. 1 will be explained below.

An FPGA is built into interface unit IU, and a first interface processor ION1, a second interface processor ION2, a third interface processor ION3, a fourth interface processor ION4, and a fifth interface processor ION5 are programmed as soft-core processors in the logic circuit of the FPGA. Interface processors ION1, . . . , ION5 are designed as flow control processors programmable by first processor CN. Each interface processor ION1, . . . , ION5 has only one processor core and is configured to execute sequentially a processor command sequence, programmed by first processor CN in interface processors ION1, . . . , ION5, whereby the time needed for executing a sequence of processor commands results exclusively from the clocking of the interface processor ION1, . . . , ION5 and the number of processor commands in the sequence. The interface processors have no technical measures to accelerate the execution of a sequence of processor commands, which would cause a decline in the predictability of the time needed for executing a sequence of processor commands. In particular, interface processors ION1, . . . , ION5 are designed not to use any caching during the execution of a sequence of processor commands. Tests have shown that it is possible to program eight soft-core-processors, designed simply in such a way, in the logic circuit of an FPGA. Each processor command sequence, programmed in an interface processor ION1, . . . , ION5, represents a program routine for routing and optionally for processing input data or output data.

The FPGA is connected via eight FPGA data connections P1, . . . , P8 to the four input data channels IN1, . . . , IN4 and to the four output data channels OUT1, . . . , OUT4 of interface unit IU, whereby each FPGA data connection contains at least one pin of the FPGA, and a first arbiter ARB1 is programmed in the FPGA logic circuit. First Arbiter ARB1 is designed to establish a data link between any interface processor ION1, . . . , ION5 and any input data channel IN1, . . . , IN4 or output data channel OUT1, . . . , OUT4 by means of a first multiplexer MUX1 and a demultiplexer DMUX (based on the flow direction of an input datum). For example, in the illustration, a data link between second interface processor ION2 and second input data channel IN2 is established, so that the input data stored in second input data channel IN2 are provided for second interface processor ION2.

First Arbiter ARB1, moreover, has a first control logic (not shown), configurable by first processor CN, for controlling first multiplexer MUX1 and demultiplexer DMUX. The first control logic is configured to receive and store five priorities from first processor CN: a first priority for first interface processor ION1, a second priority for second interface processor ION2, a third priority for third interface processor ION3, a fourth priority for fourth interface processor ION4, and a fifth priority for fifth interface processor ION5. First arbiter ARB1 is configured based on the first control logic to accept from any interface processor ION1, . . . , ION5 a request for establishing a data link to any input data channel IN1, . . . , IN4 or to any output data channel OUT1, . . . , OUT4 and to establish or not to establish the requested data link, whereby first arbiter ARB1 never denies the establishing of a requested data link permanently. If an interface processor ION1, . . . , ION5 makes a request for establishing a data link and there is no conflict, i.e., there is a request from only one interface processor ION1, . . . , ION5, then first arbiter ARB1 immediately establishes the requested data link. If there is a conflict, i.e., if there are at least two requests for establishing a data link from different interface processors ION1, . . . , ION5, then first arbiter ARB1 first establishes the data link requested by interface processor ION1, ION5 for which the highest priority is stored in the first control logic. After interface processor ION1, . . . , ION5 with the highest priority has completed the reading of the input data or the storing of the output data, a data link for interface processor ION1, . . . , ION5 with the next higher priority, from which there is a request, is established.

A second arbiter ARB2 is programmed in the FPGA logic circuit, and second arbiter ARB2 is designed to establish a data link between any interface processor ION1, . . . , ION5 and first data link DL1 by means of a second multiplexer MUX2 connected via a ninth FPGA data connection P9 to first data connection DLC1 and in this way to grant any interface processor ION1, . . . , ION5 access to first data link DL1. For example, in the illustration, second interface processor ION2 is granted access to first data link DL1, so that second interface processor ION2 can read and process input data from second input data channel IN2 and route them to an I/O task executed in first processor CN.

Second arbiter ARB2, moreover, has a second control logic (not shown), configurable by first processor CN, for controlling second multiplexer MUX2. The second control logic is configured to receive and store the first priority, second priority, third priority, fourth priority, and fifth priority from first processor CN. Second arbiter ARB2 is configured based on the second control logic to accept a request for access to first data link DL1 from any interface processor ION1, . . . , ION5 and to grant or not to grant access, whereby second arbiter ARB2 never denies access to the first data link permanently. If an interface processor ION1, . . . , ION5 makes a request for access to first data link DL1 and there is no conflict, i.e., there is a request from only one interface processor ION1, . . . , ION5, then second arbiter ARB2 establishes the requested data link immediately. If there is a conflict, i.e., if there are at least two requests for access to first data link DL1 from different interface processors ION1, . . . , ION5, then second arbiter ARB2 first grants access to the requesting interface processor ION1, . . . , ION5, for which the highest priority is stored in the second control logic. After interface processor ION1, . . . , ION5 with the highest priority has completed the routing of the input data to first processor CN, access to first data link DL1 is established for interface processor ION1, . . . , ION5 with the next highest priority, from which there is a request.

First data link DL1 is designed technically to route data from interface unit IU in the direction of first processor CN. First data link DL1 is not designed technically to route data in the opposite direction, from first processor CN in the direction of interface unit IU. Accordingly, first data link DL1 is used exclusively for routing input data to first processor CN. Output data generated by an I/O task are stored by first processor CN by means of output data link DLO, while bypassing second arbiter ARB2, in internal memory MO. Each interface processor ION1, . . . , ION5 can be configured to read output data from internal memory MO and to route them to an output data channel OUT1, . . . , OUT4. An arbitration program routine is stored in first processor CN. The arbitration program routine is configured to grant or not to grant upon request the I/O task access to output data link DLO for storing an output datum in internal memory MO. If there is a request from more than one I/O task, the arbitration program routine is configured to grant access to output data link DLO first to the requesting I/O task that is assigned the highest priority.

Internal memory MO is integrated into the FPGA logic circuit and connected via a tenth FPGA data link P10 to output data link DLC2. In one embodiment, internal memory MO is designed as a plurality of discontiguous address regions, whereby each interface processor ION1, . . . , ION5 is assigned its own address region in internal memory MO.

During the configuration phase of computer system HIL, first processor CN assigns a priority to each I/O task of the computer program. The priorities of the individual I/O tasks can be selected by a user of computer system HIL by means of a configuration software. Furthermore, interface processors ION1, . . . , ION5 or a portion of interface processors ION1, . . . , ION5 are assigned to the I/O tasks, whereby each interface processor ION1, . . . , ION5, which has been assigned to an I/O task, is unambiguously assigned to a single I/O task. Accordingly, the number of interface processors ION1, . . . , ION5, stored in interface unit IU, is an upper limit for the number of I/O tasks in the computer program. Each I/O task creates precisely one sequence of processor commands for each interface processor ION1, . . . , ION5 assigned to the I/O task, whereby each sequence represents a program routine for routing and optionally for processing input data or output data. The sequences are stored in interface processors ION1, . . . , ION5 and the priorities of the I/O tasks are stored in such a way in the first control logic of first arbiter ARB1 and in the second control logic of second arbiter ARB2 that the priority stored for any interface processor ION1, . . . , ION5 is the same as the priority of the I/O task assigned to interface processor ION1, . . . , ION5. After the configuration of interface unit IU, i.e., the loading of the sequences in interface processors ION1, . . . , ION5 and the storing of the priorities in the first control logic and the second control logic, has been completed, the execution of the computer program by the first processor CN and the execution of the sequences by interface processors ION1, . . . , ION5 are started.

Figure 3:
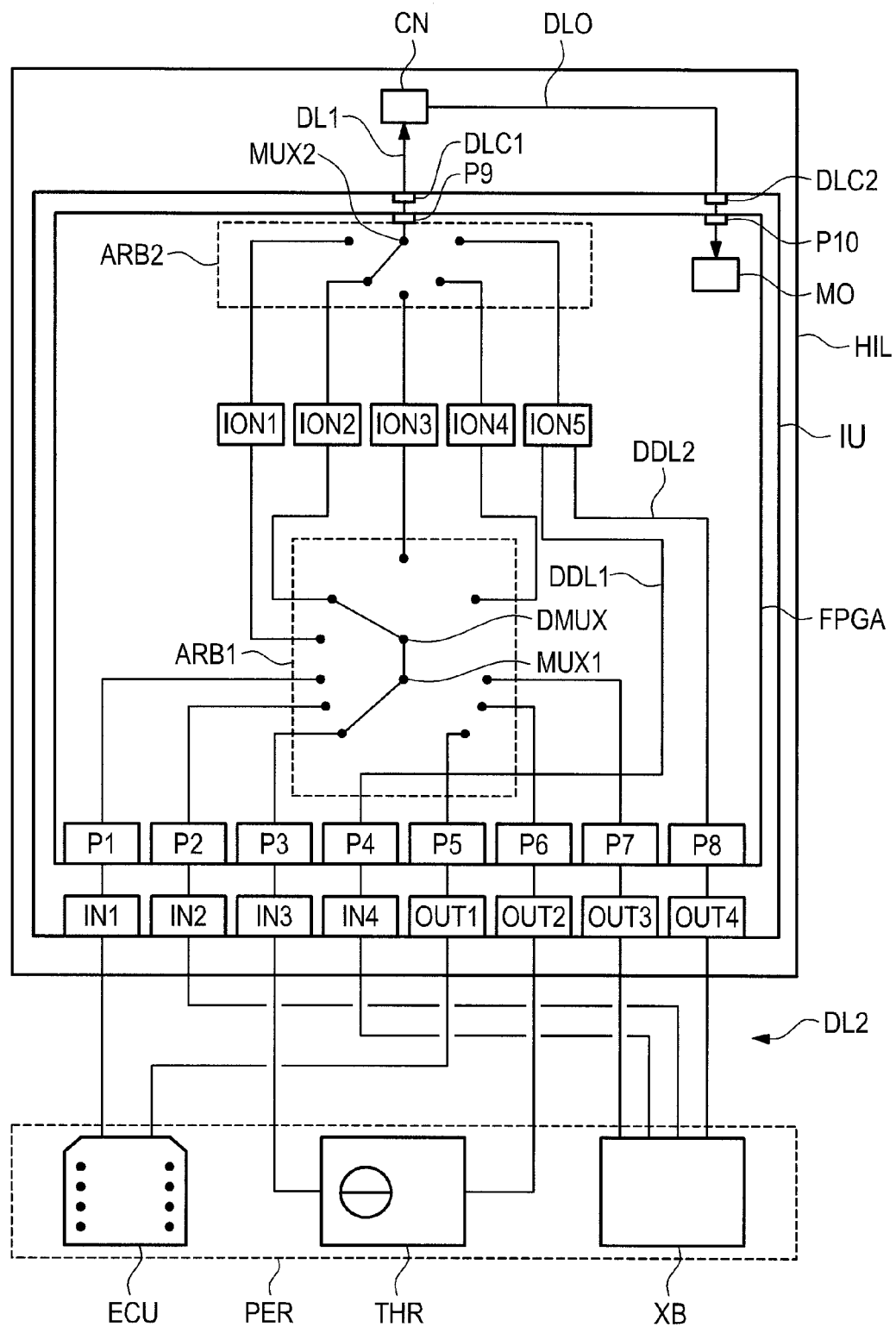
FIG. 3 shows a computer system with an interface unit according to an embodiment of the invention.

The illustration in FIG. 3 shows an embodiment of the invention. Only the differences relative to the illustrations in the previous figures will be explained below. In the exemplary embodiment shown in the illustration, of the five priorities stored in interface unit IU the fifth priority is the highest. For this reason, in each case a direct data link DDL1, DDL2, bypassing first arbiter ARB1, is established between fifth interface processor ION5 and fourth input data channel IN4 and fourth output data channel OUT4. Based on the sequence stored in fifth interface processor ION5, the fifth interface processor is configured to read input data stored in fourth input data channel IN4 and to route them to first processor CN, and fifth interface processor ION5 is configured by means of a direct data link DDL1 to read the input data from fourth input data channel IN4, without sending a request to first arbiter ARB1 for establishing a data link to the fourth input data channel IN4. Based on the sequence stored in fifth interface processor ION5, fifth interface processor ION5 is configured, furthermore, to store output data in fourth output data channel OUT4, and fifth interface processor ION5 is configured by means of a further direct data link DDL2 to store the output data in fourth input data channel, without sending a request to first arbiter ARB1 for establishing a data link to the fourth output data channel OUT4.

Fourth input data channel IN4 and fourth output data channel OUT4 are reserved exclusively for fifth interface processor ION5. First arbiter ARB1 is not designed to establish a data link between one of the four other interface processors ION1, . . . , ION4 and fourth input data channel IN4 or fourth output data channel OUT4. First arbiter ARB1 is also not designed to create a data link between fifth interface processor ION5 and an input data channel IN1, . . . , IN4 or an output data channel OUT1, . . . , OUT4. For fifth interface processor ION5, direct data links DDL1, DDL2 to all input data channels IN1, . . . , IN4 and all output data channel OUT1, . . . , OUT4 are established, which fifth interface processor ION5 accesses during the execution of the sequence stored in fifth interface processor ION5.

The data links between interface processors ION1, . . . , ION5 and input data channels IN1, . . . , IN4 and output data channel OUT1, . . . , OUT4 and first arbiter ARB1 are programmed in the logic circuit of the FPGA built into interface unit IU. For this reason, direct data links DDL1, DDL2 between interface processors ION1, . . . , ION5 and input data channels IN1, . . . , IN4 and output data channels OUT1, . . . , OUT4 can be configured flexibly according to the requirements of the computer program, stored in first processor CN, for example, for especially highly prioritized interface processors ION1, . . . , ION5 or for interface processors ION1, . . . , ION5, which have to manage an especially large data volume. For example, a configuration routine can be stored in the first processor, which routine during the configuration phase automatically creates a logic circuit for the FPGA which is stored in interface unit IU and establishes for each interface processor ION1, . . . , ION5, assigned the highest possible priority, direct data links to input data channels IN1, . . . , IN4 and output data channels OUT1, . . . , OUT4, which the particular interface processor ION1, . . . , ION5 accesses for reading or writing.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for managing prioritized input data in a computer system, the method comprising:
providing the computer system with a first processor, an interface unit with a first interface processor and a second interface processor and a first data link between the first processor and the interface unit;
configuring the interface unit to receive input data from a peripheral environment in a plurality of input data channels of the interface unit and to route the input data via the first data link to the first processor;
configuring a peripheral environment of the computer system to store input data via a second data link in the plurality of input data channels;
storing a computer program in the computer system, the computer program being configured to read in a value, defined by the input data, in order to assign a value to a variable of the computer program and the first processor being programmed to execute the computer program;

providing the interface unit with a first access management unit;

configuring the first interface processor and the second interface processor to send a request for providing the input data stored in the number of input data channels to the first access management unit and to route the input data to the first processor or to process the input data and to route the processed input data to the first processor;

storing a first priority and a second priority in the first access management unit;

configuring the first access management unit to provide or not to provide upon request the input data stored in the plurality of input data channels to the first interface processor and the second interface processor during execution of the computer program, and to provide the input data first to the first interface processor if there is a request for providing the input data stored in the number of input data channels from both the first interface processor and the second interface processor and if the first priority is higher than the second priority, wherein a first task and a second task of the computer are configured to read in a value, defined by the input data, in order to assign a value to a variable of the computer program, wherein the first task is assigned a first priority and the second task a second priority, wherein the first interface processor is configured to route input data to the first task or to process input data and to route the processed input data to the first task, wherein the second interface processor is configured to route input data to the second task or to process input data and to route the processed input data to the second task, and wherein the first priority assigned to the first task and the second priority assigned to the second task are stored in the first access management unit.

2. The method according to claim 1, wherein the computer system is configured to execute the computer program in hard real time, and wherein the computer system is designed as a hardware-in-the-loop simulator or a rapid control prototyping platform.

3. The method according to claim 1, wherein the interface unit has a second access management unit, wherein the first interface processor and the second interface processor are configured to send to the second access management unit a request for access to the first data link, wherein the second access management unit is configured to grant or not to grant the first interface processor and the second interface processor access to the first data link upon a request during the execution of the computer program and to grant the first interface processor access to the first data link first, if there is a request for access to the first data link from both the first interface processor and the second interface processor and if the first priority is higher than the second priority.

4. The method according to claim 1, wherein a configuration phase of the computer system is started before the execution of the computer program is begun by the first processor, and wherein the computer system or the first processor configures the first interface processor and the second interface processor during the configuration phase and stores the first priority and the second priority in the first access management unit or stores the first priority and the second priority in the first access management unit and the second access management unit.

5. The method according to claim 1, wherein the interface unit has more than two interface processors, wherein each interface processor is either unambiguously assigned to a task of the computer program or is not assigned to any task of the computer program, wherein each interface processor is configurable to make a request for providing input data stored in the number of input data channels, and wherein a priority is stored for each interface processor assigned to a task.

6. The method according to claim 5, wherein the interface unit has an output data channel for storing output data for reading by the peripheral environment, wherein a third interface processor is configured to store output data generated by the computer program in the output data channel, and wherein a first direct data link, bypassing the second access management unit, is established between the third interface processor and the first processor.

7. The method according to claim 1, wherein the interface unit has more than two interface processors and a second direct data link, bypassing the first access management unit, is established between an interface processor and an input data channel.

8. The method according to claim 4, wherein the interface processors during the configuration phase are implemented as soft-core processors in an FPGA, and wherein the soft-core processors are designed as flow control processors.

9. An interface unit for data exchange between a first processor of a computer system and a peripheral of the computer system, the interface unit comprising:

a data connection for connecting the interface unit to a first data link of the computer system, wherein data are transferable from the interface unit to the first processor via the first data link;

a plurality of input data channels for receiving input data from the peripheral environment, the input data being stored in the number of input data channels; and a first access management unit configured to receive a request for providing the input data stored in the plurality of input data channels from a first interface processor stored in the interface unit and from a second interface processor stored in the interface unit, and to provide or not to provide upon request the input data stored in the number of input data channels to the first interface processor and the second interface processor, wherein a first priority and a second priority are stored in the first access management unit, wherein the first access management unit is configured to provide the input data, stored in the number of input data channels first to the first interface processor, if there is a request for providing the input data, stored in the number of input data channels from both the first interface processor and the second interface processor and if the first priority is higher than the second priority.

10. The interface unit according to claim 9, wherein the interface unit a replaceable interface unit or a plug-in I/O card.

11. The interface unit according to claim 9, wherein the interface unit is designed and provided to be built into a computer system for executing a computer program in hard real time, or to be built into a hardware-in-the-loop simulator or into a rapid control prototyping platform.

12. The interface unit according to claim 9, wherein the interface unit has a second access management unit, the first priority and the second priority being stored in the second access management unit, and wherein the second access management unit is configured to accept a request for access to the first data link from the first interface processor and from the second interface processor and grants or does not grant access and to grant access to the first data link first for the first interface processor, if there is a request for access to the first data link from both the first interface processor and the second interface processor and if the first priority is higher than the second priority.

13. The interface unit according to claim 9, wherein the interface unit has an FPGA programmable by the computer system and the FPGA is configured to store the first interface processor and the second interface processor in the form of soft-core processors.

14. The interface unit according to claim 9, wherein the first access management unit is configured to provide input data, stored in any input data channel to the first interface processor and the second interface processor.

* * * * *